(12) United States Patent
Lin et al.

(10) Patent No.: US 9,914,841 B2
(45) Date of Patent: Mar. 13, 2018

(54) POLYIMIDE FILM INCORPORATING A COLORED POLYIMIDE MATTING POWER AND MANUFACTURE THEREOF

(71) Applicant: TAIMIDE TECHNOLOGY INCORPORATION, Xinpu Township (TW)

(72) Inventors: Chih-Wei Lin, Xinpu Township (TW); Wu-Yung Yang, Xinpu Township (TW)

(73) Assignee: Taimide Technology Incorporation, Hsinchu County (TW)

( * ) Notice: Subject to any disclaimer, the term of this patent is extended or adjusted under 35 U.S.C. 154(b) by 753 days.

(21) Appl. No.: 14/165,274

(22) Filed: Jan. 27, 2014

(65) Prior Publication Data

US 2014/0220335 A1     Aug. 7, 2014

(30) Foreign Application Priority Data

Jan. 28, 2013 (TW) .............................. 102103207 A
Nov. 29, 2013 (TW) .............................. 102143793 A (51) Int. Cl.
| | |
|---|---|
| *C08K 3/04* | (2006.01) |
| *C08K 3/36* | (2006.01) |
| *B32B 5/16* | (2006.01) |
| *B32B 27/20* | (2006.01) |
| *C08L 79/08* | (2006.01) |
| *C09D 7/00* | (2018.01) |
| *B29C 41/24* | (2006.01) |
| *H05K 9/00* | (2006.01) |
| *C08J 3/22* | (2006.01) |
| *C08K 3/00* | (2018.01) |
| *C08K 5/00* | (2006.01) |
| *B29K 105/00* | (2006.01) |
| *B29K 79/00* | (2006.01) |
| *C08K 13/02* | (2006.01) |

(52) U.S. Cl.
CPC .............. *C09D 7/005* (2013.01); *B29C 41/24* (2013.01); *C08J 3/226* (2013.01); *C08K 3/0033* (2013.01); *C08K 5/0041* (2013.01); *H05K 9/0084* (2013.01); *B29K 2079/08* (2013.01); *B29K 2105/0032* (2013.01); *C08J 2379/08* (2013.01); *C08J 2479/08* (2013.01); *C08K 13/02* (2013.01); *Y10T 428/254* (2015.01)

(58) Field of Classification Search
CPC . C08J 2379/08; C08J 2479/08; C08K 5/0041; C08K 3/04; C08K 3/0033; C08K 3/36; C08L 79/08; B32B 5/16; B32B 27/20
See application file for complete search history.

(56) References Cited

U.S. PATENT DOCUMENTS

| | | | |
|---|---|---|---|
| 2012/0251808 A1* | 10/2012 | Carney ................ | C08G 73/105 428/220 |
| 2013/0029148 A1 | 1/2013 | Carney | |
| 2013/0029166 A1* | 1/2013 | Carney ...................... | C08J 5/18 428/473.5 |
| 2013/0065033 A1* | 3/2013 | Wu .......................... | B32B 27/08 428/212 |
| 2013/0273254 A1* | 10/2013 | Hsu .......................... | C08K 3/04 427/379 |

FOREIGN PATENT DOCUMENTS

| | | |
|---|---|---|
| CN | 101089030 | 12/2007 |
| CN | 101579904 | 11/2009 |
| JP | 61250030 | 7/1986 |
| JP | 63081160 | 4/1988 |
| JP | 06501738 | 2/1994 |
| JP | 06212075 | 8/1994 |
| JP | 2006-307146 | 9/2006 |
| JP | 2008106250 | 5/2008 |
| JP | 2009-001825 | 1/2009 |
| TW | 201233548 | 8/2012 |

OTHER PUBLICATIONS

Official Action from Japan patent application No. 2014-012294 dated Nov. 25, 2014.
Office Action dated Aug. 27, 2014 of Taiwan Patent Application No. 102143793.
Office Action dated Nov. 25, 2014 of Japanese Patent Application No. 2014-012294.

* cited by examiner

*Primary Examiner* — Charles Boyer (57) ABSTRACT

A colored matting powder includes particles containing a polyimide obtained by reacting diamine and dianhydride monomers at a substantially equal molar ratio, and a pigment incorporated with the polyimide, a portion of the pigment being located at an outer surface of the particles. Moreover, a colored polyimide film is also described as incorporating the colored matting powder, and can exhibit low gloss, low transparency and good insulation.

20 Claims, 6 Drawing Sheets

FIG. 1

| Example | Matting agent | Carbon black contained in the matting agent | | Polyimide film | | | | |
|---|---|---|---|---|---|---|---|---|
| | | Catalog No. | Content (wt%) | Matting agent | | 60° gloss | α ($\mu m^{-1}$) | volume resistivity (Ω-cm) |
| | | | | d.t. ($\mu m$) | Content (wt%) | | | |
| 1 | Black matting powder | M1400 | 13.0 | 4-7 | 12 | 12 | 0.16 | $1.6 \times 10^{16}$ |
| 2 | Black matting powder | M1400 | 28.6 | 4-7 | 12 | 9 | 0.25 | $1.5 \times 10^{16}$ |
| 3 | Black matting powder | M1400 | 37.5 | 4-7 | 12 | 11 | 0.32 | $7.5 \times 10^{15}$ |
| 4 | Black matting powder | M1400 | 37.5 | 4-7 | 5 | 45 | 0.18 | $1.2 \times 10^{16}$ |
| 5 | Black matting powder | M1400 | 37.5 | 4-7 | 7 | 29 | 0.21 | $7.6 \times 10^{15}$ |
| 6 | Black matting powder | M1400 | 37.5 | 4-7 | 15 | 8 | 0.38 | $3.6 \times 10^{15}$ |
| 7 | Black matting powder | M1400 | 37.5 | 4-7 | 20 | 6 | 0.49 | $1.1 \times 10^{15}$ |
| 8 | Black matting powder | R400R | 37.5 | 4-6 | 12 | 14 | 0.40 | $7.3 \times 10^{15}$ |
| 9 | Black matting powder | SB4A | 37.5 | 4-7 | 12 | 10 | 0.41 | $1.2 \times 10^{16}$ | d.t.: average particle diameter

FIG. 2

| Example | Matting agent | White pigment contained in the matting agent | | Polyimide film | | | | | |
|---|---|---|---|---|---|---|---|---|---|
| | | Type | Content (wt%) | Matting agent | | 60° gloss | α ($\mu m^{-1}$) | volume resistivity ($\Omega \cdot cm$) |
| | | | | d.t. (μm) | Content (wt%) | | | |
| 10 | White matting powder | $TiO_2$ | 13.0 | 5-8 | 12 | 19 | 0.42 | $1.9 \times 10^{16}$ |
| 11 | White matting powder | $TiO_2$ | 28.6 | 5-8 | 12 | 14 | 0.46 | $1.8 \times 10^{16}$ | d.t.: average particle diameter

FIG. 3

| Comparative Example | Matting agent | Carbon black contained in the matting agent | | Polyimide film | | | | |
|---|---|---|---|---|---|---|---|---|
| | | Catalog No. | Matting agent | Matting agent | | 60° gloss | α ($\mu m^{-1}$) | volume resistivity (Ω-cm) |
| | | | | d.t. (μm) | Content (wt%) | | | |
| 1 | Carbon black M1400 | -- | | 0.016 | 12 | 130 | 0.58 | overcurrent |
| 2 | Carbon black M1400 | -- | | 0.016 | 5 | 90 | 0.31 | overcurrent |
| 3 | Carbon black SB4A | -- | | 0.025 | 12 | 76 | 0.65 | overcurrent |
| 4 | PI | -- | | 4-6 | 0.5 | 131 | 0.023 | $1.6 \times 10^{15}$ |
| 5 | PI | -- | | 4-6 | 1 | 102 | 0.019 | $1.5 \times 10^{15}$ |
| 6 | PI | -- | | 4-6 | 5 | 35 | 0.019 | $1.4 \times 10^{15}$ |
| 7 | PI | -- | | 4-6 | 9 | 14 | 0.023 | $1.5 \times 10^{15}$ |
| 8 | PI | -- | | 4-6 | 12 | 18 | 0.018 | $1.6 \times 10^{15}$ |
| 9 | PI | -- | | 4-6 | 20 | 10 | 0.025 | $1.4 \times 10^{15}$ |
| 10 | SiO$_2$ | -- | | 4-6 | 5 | 33 | 0.04 | $1.7 \times 10^{15}$ |
| 11 | PI + carbon black M1400 | -- | | 4-6/ 0.016 | 12 (7.5/ 4.5) | 27 | 0.32 | overcurrent |
| 12 | Black matting powder | M1400 | 44.4 | 3-5 | 12 | 32 | 0.42 | overcurrent |
| 13 | Black matting powder | M1400 | 50 | 3-6 | 12 | 26 | 0.49 | overcurrent |
| 14 | Black matting powder | M1400 | 37.5 | 4-7 | 0.5 | 121 | 0.04 | $2.1 \times 10^{16}$ |
| 15 | Black matting powder | M1400 | 37.5 | 4-7 | 1 | 106 | 0.06 | $1.8 \times 10^{16}$ |
| 16 | Black matting powder | M1400 | 37.5 | 4-7 | 3 | 73 | 0.10 | $1.2 \times 10^{16}$ | d.t.: average particle diameter
PI: polyimide powder

POLYIMIDE FILM INCORPORATING A COLORED POLYIMIDE MATTING POWER AND MANUFACTURE THEREOF

CROSS-REFERENCE TO RELATED APPLICATIONS

This application claims priority to Taiwan patent application No. 102103207 filed on Jan. 28, 2013, and to Taiwan patent application No. 102143793 filed on Nov. 29, 2013.

BACKGROUND OF THE INVENTION

1. Field of the Invention

The present application relates to polyimide powders, and more particularly to a colored polyimide powder used as a matting agent in a polyimide film.

2. Description of the Related Art

Flexible printed circuits (FPC) are widely used in electronic products, optical lens, LCD modulus, solar cells and the like. The flexible printed circuit usually includes a substrate or coverlay made of a polyimide film. These applications usually require that the polyimide film has low gloss, low transparency and good insulation. Low gloss allows the product to have a more aesthetic appearance, and insulation and low transparency can protect the printed circuit of the flexible printed circuit.

Generally, a matting agent and a colored additive (e.g., a pigment or a dye) are both used to fabricate the polyimide film. In a conventional fabrication process, a color additive (such as carbon black) is usually incorporated to reduce the transparency of the polyimide film, while a matting agent such as $SiO_2$ may be added to reduce the gloss of the polyimide film. However, neither the colored additive nor the matting agent alone can achieve extinction and reduces transparency. Accordingly, the conventional fabrication process needs to use a large amount of the color additive and the matting agent to impart the desired properties to the polyimide film, which may cause problems such as difficult operations and poor dispersion of the additives.

Therefore, there is a need for a new approach that can fabricate a polyimide film with desirable characteristics in a cost-effective manner, and overcome the aforementioned issues.

SUMMARY

The present application describes a colored matting powder including particles containing a polyimide obtained by reacting diamine and dianhydride monomers at a substantially equal molar ratio, and a pigment incorporated with the polyimide, a portion of the pigment being located at an outer surface of the particles.

The present application also describes a colored polyimide film including a polyimide-based polymer constituting the main structure of the film obtained by reacting diamine and dianhydride monomers at a substantially equal molar ratio, and the colored matting powder distributed in the polyimide film.

In other embodiments, the present application further describes an electromagnetic interference shielding structure including the colored polyimide film and a metal layer, the metal layer being arranged on an outer surface of the colored polyimide film.

In other embodiments, the present application also describes a method for preparing a colored polyimide film. The method includes obtaining a polyamic acid solution by reacting diamine and dianhydride monomers, adding the colored matting powder into the polyamic acid solution to obtain a colored mixture solution, coating a layer of the colored mixture solution on a support, and heating the layer to form a film.

DETAILED DESCRIPTION OF THE EMBODIMENTS

The present application describes a colored matting powder that includes particles containing a polyimide obtained by reacting diamine and dianhydride monomers at a substantially equal molar ratio, and a pigment incorporated with the polyimide, a portion of the pigment being located at an outer surface of the particles. Accordingly, the colored matting powder can be comprised of colored particles and exhibits a distinctive color different from pure polyimide particles, which are generally transparent and colorless, or transparent and lightly yellow or lightly brown.

The colored matting powder has a particle average diameter of about 2 to 10 micrometer (μm). Exemplary values of average diameters can include 2, 2.5, 3, 3.5, 4, 4.5, 5, 5.5, 6, 6.5, 7, 7.5, 8, 9, 9.5, 10 μm, or any intermediate values between the aforementioned values. In some embodiments, the colored matting powder has an average particle diameter between about 3 and about 8 μm. More specifically, the average particle diameter of the colored matting powder can be between about 4 and about 7 μm.

In one embodiment, the pigment contained in the colored matting powder is between about 10 wt % and about 40 wt % based on the total weight of the colored matting powder. Exemplary values of the pigment weight ratio can include 10%, 11%, 12%, 13%, 14%, 15%, 20%, 25%, 30%, 35%, 37%, 37.5%, 40%, or any intermediate values between the aforementioned values.

The pigment contained in the colored matting powder can be organic pigment or inorganic pigment such as black pigment, white pigment, red pigment, orange pigment, yellow pigment, green pigment, blue pigment or purple pigment. The pigments can be used alone or in combination.

For example, the pigment can include, without limitation, cadmium red, cadmium vermilion, Alizarin Crimson, permanent magenta, Van Dyke brown, barium lemon yellow, cadmium yellow lemon, cadmium yellow light, cadmium yellow middle, cadmium yellow orange, Scarlet Lake, Raw Umber Greenish, Burnt Umber, or any mixture thereof.

In some embodiments, the pigment can also be selected from compounds classified in a color index (C.I.), e.g., the color index published by The Society of Dyers and Colourists. For example, yellow pigments can include C.I. pigment yellow 1, C.I. pigment yellow 3, C.I. pigment yellow 12, C.I.

pigment yellow 13, C.I. pigment yellow 14, C.I. pigment yellow 15, C.I. pigment yellow 16, C.I. pigment yellow 17, C.I. pigment yellow 20, C.I. pigment yellow 24, C.I. pigment yellow 31, C.I. pigment yellow 53, C.I. pigment yellow 83, C.I. pigment yellow 86, C.I. pigment yellow 93, C.I. pigment yellow 94, C.I. pigment yellow 109, C.I. pigment yellow 110, C.I. pigment yellow 117, C.I. pigment yellow 125, C.I. pigment yellow 128, C.I. pigment yellow 137, C.I. pigment yellow 138, C.I. pigment yellow 139, C.I. pigment yellow 147, C.I. pigment yellow 148, C.I. pigment yellow 150, C.I. pigment yellow 153, C.I. pigment yellow 154, C.I. pigment yellow 166, C.I. pigment yellow 173, C.I. pigment yellow 194, C.I. pigment yellow 214 and the like.

Orange pigments can include C.I. pigment orange 13, C.I. pigment orange 31, C.I. pigment orange 36, C.I. pigment orange 38, C.I. pigment orange 40, C.I. pigment orange 42, C.I. pigment orange 43, C.I. pigment orange 51, C.I. pigment orange 55, C.I. pigment orange 59, C.I. pigment orange 61, C.I. pigment orange 64, C.I. pigment orange 65, C.I. pigment orange 71, C.I. pigment orange 73 and the like.

Red pigments can include C.I. pigment red 9, C.I. pigment red 97, C.I. pigment red 105, C.I. pigment red 122, C.I. pigment red 123, C.I. pigment red 144, C.I. pigment red 149, C.I. pigment red 166, C.I. pigment red 168, C.I. pigment red 176, C.I. pigment red 177, C.I. pigment red 180, C.I. pigment red 192, C.I. pigment red 209, C.I. pigment red 215, C.I. pigment red 216, C.I. pigment red 224, C.I. pigment red 242, C.I. pigment red 254, C.I. pigment red 264, C.I. pigment red 265 and the like.

Blue pigments can include C.I. pigment blue 15, C.I. pigment blue 15:3, C.I. pigment blue 15:4, C.I. pigment blue 15:6, C.I. pigment blue 60 and the like.

Purple pigments can include C.I. pigment purple 1, C.I. pigment purple 19, C.I. pigment purple 23, C.I. pigment purple 29, C.I. pigment purple 32, C.I. pigment purple 36, C.I. pigment purple 38 and the like.

Green pigments can include C.I. pigment green 7, C.I. pigment green 36 and the like. Brown pigments can include C.I. pigment brown 23, C.I. pigment brown 25 and the like. Black pigments can include C.I. pigment black 1, C.I. pigment black 7 and the like.

In some embodiments, a black pigment may be used to prepare a black matting powder. The black pigment can include, without limitation, carbon black, cobalt oxide, Fe—Mn—Bi black, Fe—Mn oxide spinel black, $(Fe,Mn)_2O_3$ black, copper chromite black spinel, lamp black, bone black, bone ash, bone char, hematite, iron oxide black, micaceous iron oxide, black complex inorganic color pigment (CICP), $CuCr_2O_4$ black, $(Ni,Mn,Co)(Cr,Fe)_2O_4$ black, aniline black, perylene black, anthraquinone black, chrome green black hematite, iron-chromium mixed oxides and the like, which can be used alone or in combination.

In other embodiments, a white pigment may be incorporated to prepare a white matting powder. The white pigment can include, without limitation, titanium dioxide ($TiO_2$), aluminum oxide ($Al_2O_3$), calcium carbonate ($CaCO_3$), calcium sulfate ($CaSO_4$), silicon dioxide ($SiO_2$), boron nitride (BN), aluminum nitride (AlN), clay, zirconium oxide ($ZrO_2$), zinc oxide ($ZnO_2$), zinc sulfide ($ZnS_2$), and barium sulfate ($BaSO_4$), clay and the like, which can be used alone or in combination.

The polyimide particles may be produced by condensation polymerization of diamine and dianhydride monomers. In order to obtain polyimide particles with a stable and desirable particle size, the molar ratio of diamine to dianhydride is about 1:0.800 to 1:1. The diamine can be exemplary selected from oxydianiline (ODA) (e.g. 4,4'-ODA, 3,4'-ODA), phenylene diamine (PDA) (e.g. m-PDA, p-PDA), 2,2'-bis(trifluoromethyl)benzidine (TFMB) and the like, which can be used alone or in combination. The dianhydride can be exemplary selected from pyromellitic dianhydride (PMDA), 3,3',4,4'-biphenyltetracarboxylic dianhydride (3,3',4,4'-BPDA) and 2,2-bis[4-(3,4-dicarboxyphenoxy)phenyl]propane dianhydride (BPADA) and the like, which can be used alone or in combination.

The diamine (e.g., 4,4'-ODA) and the dianhydride (e.g. PMDA) with the aforementioned molar ratio may be first reacted together in a solvent during a condensation polymerization to obtain a polyamic acid (PAA) solution. The solvent can be a non-protonic polar solvent. The solvent can have a relatively low boiling point (e.g., below about 225° C.) so as to facilitate its removal from the polyimide film at a relatively low temperature. Examples of suitable solvents may include dimethylacetamide (DMAC), N,N'-dimethylformamide (DMF) and the like. The total weight of the diamine and the dianhydride is between about 2 and 20 wt % of the total weight of the reaction solution. In one embodiment, the weight of the diamine and the dianhydride can be between about 5 and 15 wt % of the total weight of the reaction solution.

A pigment slurry is obtained by mixing the pigment and a solvent. The solvent can be similar to the solvent used in the PAA solution. Then the pigment slurry is mixed with the PAA solution, a dehydrant and a catalyst, and agitated to obtain a homogeneous reaction solution.

The dehydrant can be selected from aliphatic acid anhydrides (e.g., acetic anhydride and propionic anhydride) and aromatic acid anhydrides (e.g., benzoic anhydride and phthalic anhydride), which may be used alone or in combination. For example, the selected dehydrant may be acetic anhydride, and the used amount is between about 2 and about 3 moles per equivalent of the polyamic acid.

The catalyst can be selected from heterocyclic tertiary amines (e.g., picoline, pyridine, lutidine, quinoline, imidazole, N-methylpyrolidone, N-ethylpyrrolidone, N-methylpiperidine, N-ethylpiperidine and the like), aliphatic tertiary amines (e.g., triethylamine (TEA), tripropylamine, tributylamine, triethanolamine, N,N-dimethylethanolamine, triethylenediamine and diisopropylethylamine (DIPEA)), and aromatic tertiary amines (e.g., dimethylaniline), which may be used alone or in combination. In one embodiment, the selected catalyst is exemplary picoline, such as •α-picoline, •β-picoline, or •γ-picoline. The polyamic acid:dehydrant: catalyst molar ratio can be about 1:2:1, wherein for every mole of polyamic acid, there is about 2 moles of dehydrant and about 1 mole of catalyst.

The reaction solution is heated to obtain a precipitate of the polyimide and the pigment. The precipitate can be further washed, filtrated and dried to form the colored matting powder.

The present application also describes a colored polyimide film comprising a polyimide-based polymer constituting the main structure of the film produced by reacting diamine and dianhydride monomers at substantially equal molar ratio, and the colored matting powder distributed in the polyimide film. The colored polyimide film may have a thickness between about 3 μm and about 125 μm. More specifically, the thickness of the colored polyimide film can be between about 5 μm and about 50 μm.

The colored matting powder (i.e. the power formed by polyimide and pigment) is used as a matting agent for the polyimide film, and can form uneven microstructures on an outer surface of the polyimide film and/or light-scattering structures in the polyimide film. Incident light thereby can be scattered to reduce gloss. Moreover, the pigment contained in the colored matting powder can impart a desirable color to the film. In particular, the color of the polyimide film may be substantially rendered by the colored matting powder, whereas the polyimide-based polymer constituting the main structure of the film is transparent colorless, or lightly yellow or lightly brown. In other words, the incorporation of the colored matting powder can impart the desired color and gloss reduction to the polyimide film.

The polyimide-based polymer can be obtained by reacting diamine with dianhydride monomers, the molar ratio of the diamine and dianhydride monomers being substantially equal to 1:1. One of more types of diamine monomers can be reacted with one or more types of dianhydride monomers to form the polyimide-based polymer. Examples of the diamine monomer can include ODA (e.g., 4,4'-ODA, 3,4'-ODA), PDA (e.g., m-PDA, p-PDA), TFMB and the like. Examples of the dianhydride monomer can include PMDA, BPDA, BPADA and the like.

The colored matting powder is incorporated in the polyimide film at a weight ratio between about 5 wt % and about 20 wt % based on the total weight of the polyimide film. Exemplary values of the weight ratio can include 5, 5.5, 6, 6.5, 7, 7.5, 8, 9, 9.5, 10, 11, 12, 13, 14, 15, 16, 17, 18, 19, 20 wt %, or any intermediate values between the aforementioned values. In some embodiments, the weight ratio of the colored matting powder can be between about 7 wt % and 18 wt %. Moreover, the colored matting powder can have an average particle diameter between about 2 and about 10 μm. In some embodiments, the average particle diameter of the colored matting powder can be between about 3 and about 8 μm, and more particularly between about 4 and about 7 μm.

In one example of implementation, the colored polyimide film may include a polyimide-based polymer constituting the main structure of the film, and a colored matting powder having an average particle diameter between about 4 and about 7 μm and a weight ratio between about 12 wt % and about 20 wt % of the total weight of the film.

The colored polyimide film can exhibit improved characteristics of gloss, extinction coefficient and volume resistivity. The 60° gloss value can be 45 or less, in particular less than 40, or even lower than 30. The extinction coefficient (a) can be about 0.15 $\mu m^{-1}$ or higher, in particularly higher than 0.2 $\mu m^{-1}$, or even higher than 0.3 $\mu m^{-1}$. The volume resistivity of the film can be about $1 \times 10^{15}$ Ω-cm or more, preferably $5 \times 10^{15}$ Ω-cm or more, and more preferably $1 \times 10^{16}$ Ω-cm or more.

Owing to enhanced heat resistance and insulation property of the polyimide, the colored matting powder can have stable properties when chemical conversion is performed under a temperature range between 250° C. and 500° C. As a result, the occurrence of non-uniform color defects induced by melting of the colored matting powder during fabrication of the polyimide film can be prevented. By adjusting the ratio of the pigment and the polyimide contained in the colored matting powder, the polyimide film can also exhibit a higher volume resistivity, which makes it particularly suitable for applications requiring high insulation property, low gloss and high shielding capability.

Figure 1:
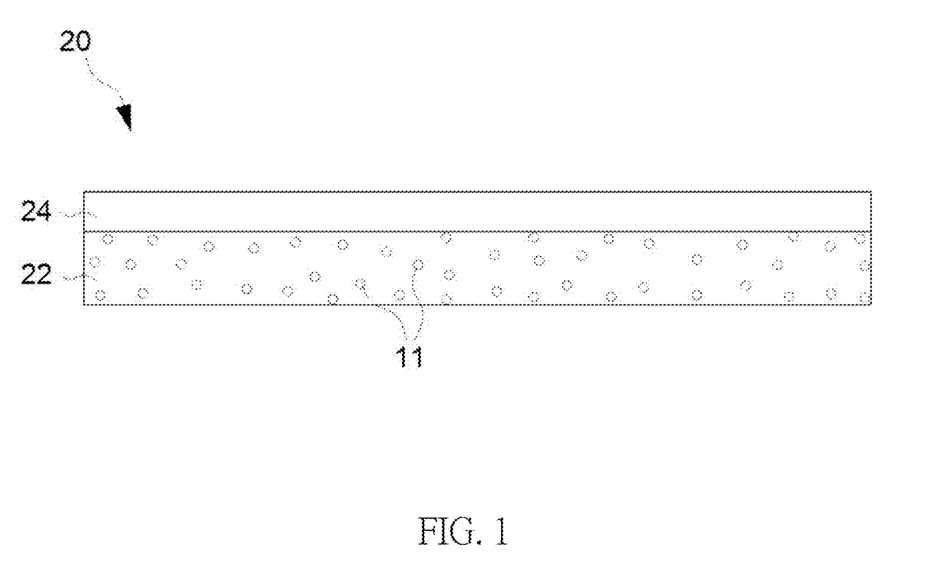
FIG. 1 is a schematic view illustrating an embodiment of an electromagnetic interference shielding structure incorporating a colored polyimide film.

FIG. 1 is a schematic view illustrating an electromagnetic interference shielding structure 20 using the aforementioned colored polyimide film. The electromagnetic interference shielding structure 20 can include a colored polyimide film 22 and a metal layer 24, the metal layer 24 being arranged on an outer surface of the colored polyimide film 22. The colored polyimide film 22 can include a polyimide-based polymer constituting the main structure of the film, and a colored matting powder 11. The metal layer 24 can be made of aluminum (Al), copper (Cu), nickel (Ni), iron (Fe), silver (Ag), chromium (Cr), palladium (Pd), molybdenum (Mo), or an alloy of any of the aforementioned metals.

More detailed examples of fabricating a colored polyimide film are described hereinafter.

EXAMPLES

Example 1

Step (1): Preparation of a Black Matting Powder.

About 500 g of carbon black (i.e., the carbon black sold under designation No. M1400 by CABOT Company) and about 8,500 g of DMAC can be mixed and agitated for about 60 minutes. The mixture then can be processed through a grinder to obtain a carbon black slurry.

In a three-necked flask, about 58.1 g of the carbon black slurry and about 400 g of a PAA solution containing about 6 wt % of solid content copolymerized by 4,4'-ODA and PMDA at a molar ratio 1:0.990 can be mixed and agitated homogeneously to obtain a black PAA solution. The black PAA solution then can be heated under a temperature condition increasing at a rate of 2° C./min to about 160° C., and then at 160° C. for about 3 hours to form a black polyimide precipitate. The carbon black content of the precipitate can be about 13 wt %. After cooling down to room temperature, the precipitate can be rinsed by DMAC and ethanol, undergo vacuum filtration, and then heated at about 160° C. in an oven for about 1 hour to obtain the black matting powder.

Step (2): Preparation of a Slurry of the Black Matting Powder.

Under room temperature, about 0.92 g of the black matting powder and about 5.52 g of DMAC can be mixed and agitated for about 60 minutes. The weight ratio of the black matting powder to DMAC can be about 1:6. Then the mixture can be processed through a grinder (e.g., known under the designation Buhler Drais SF12) operating at 800 rpm for 3 minutes, and then filtrated through a 250 mesh stainless steel filter to obtain a slurry of the black matting powder having a viscosity of about 400 cps.

Step (3): Preparation of the Black Polyimide Film.

About 6.44 g of the slurry of the black matting powder obtained from the aforementioned step, and about 50 g of a PAA solution containing about 15 wt % of solid content copolymerized by 4,4'-ODA and PMDA at a molar ratio of 1:0.990 can be mixed and agitated homogeneously to obtain a black PAA solution. The black PAA solution can be coated on a glass plate support and heated in an oven. The heating condition in the oven can be set at a temperature of 80° C. for 30 minutes to remove the solvent, and then between 170° C. and 370° C. for 4 hours to form a black polyimide film. The film peeled from the glass plate support contains about 12 wt % of the black matting powder and has a thickness equal to about 13 μm.

Example 2

A film is prepared like in Example 1 except that in step (1), about 155.8 g of carbon black slurry is mixed with about 400 g of DMAC, and the obtained black matting powder has about 28.6 wt % of carbon black content.

Example 3

A film is prepared like in Example 1 except that in step (1), about 233.3 g of the carbon black slurry us mixed with about 400 g of DMAC, and the obtained black matting powder has about 37.5 wt % of carbon black content.

Example 4

A film is prepared like in Example 1 except that in step (3), the slurry of the black matting powder contains about 0.355 g of the black matting powder and about 2.13 g of DMAC, and the weight ratio of the matting powder in the obtained black polyimide film is about 5.0 wt %.

Example 5

A film is prepared like in Example 1 except that in step (3), the slurry of the black matting powder contains about 0.508 g of the black matting powder and about 3.408 g of DMAC, and the weight ratio of the matting powder in the obtained black polyimide film is about 7.0 wt %.

Example 6

A film is prepared like in Example 1 except that in step (3), the slurry of the black matting powder contains about 1.191 g of the black matting powder and about 7.146 g of DMAC, and the weight ratio of the matting powder in the black polyimide film is about 15 wt %.

Example 7

A film is prepared like in Example 1 except that in step (3), the slurry of the black matting powder contains about 1.69 g of the black matting powder and about 10.14 g of DMAC, and the weight ratio of the matting powder in the black polyimide film is about 20 wt %.

Example 8

A film is prepared like in Example 1 except that the carbon black is the one sold under designation No. R400R by CABOT Company.

Example 9

A film is prepared like in Example 1 except that the carbon black is the one sold under designation No. SB4A by Orion Company.

Example 10

Step (1): Preparation of a White Matting Powder.
About 500 g of $TiO_2$ and about 8,500 g of DMAC can be mixed and agitated for about 60 minutes. The mixture then can be processed through a grinder to obtain a white slurry.
In a three-necked flask, about 58.1 g of the white slurry, and about 400 g of a PAA solution containing about 6 wt % of solid content copolymerized by TFMB, p-PDA and BPDA can be mixed and agitated homogeneously to obtain a white PAA solution. The white PAA solution can be heated under a temperature condition increasing at a rate of 2° C./min to about 160° C., and then at 160° C. for 3 hours to form a white polyimide precipitate. The white pigment content of the precipitate is about 13 wt %. After cooling down to room temperature, the precipitate can be rinsed by DMAC and ethanol, undergo vacuum filtration, and then heated at about 160° C. in an oven for about 1 hour to obtain the white matting powder.

Step (2): Preparation of a Slurry of the White Matting Powder.
Under room temperature, about 0.92 g of the white matting powder and about 5.52 g of DMAC can be mixed and agitated for about 60 minutes. The weight ratio of the white matting powder to DMAC can be about 1:6. Then the mixture can be processed through a grinder to obtain a slurry of the white matting powder.

Step (3): Preparation of the White Polyimide Film.
About 6.44 g of the slurry of the white matting powder obtained from the aforementioned step, and about 50 g of a PAA solution containing about 15 wt % of solid content copolymerized by 4,4'-ODA, p-PDA and PMDA can be mixed and agitated homogeneously to obtain a white PAA solution. The white PAA solution can be coated on a glass plate support and heated in an oven. The heating condition can be set at a temperature of 80° C. for 30 minutes to remove the solvent, and then between 170° C. and 370° C. for 4 hours to form a white polyimide film. The film peeled from the glass plate support contains about 12 wt % of the white matting powder and has a thickness equal to about 13 µm.

Example 11

A film is prepared like in Example 10 except that in step (3), about 155.8 g of the white slurry can be mixed with about 400 g of PAA, and the obtained white matting powder contains about 28.6 wt % of $TiO_2$.

Comparative Example 1

Step (1): Preparation of the Carbon Black Slurry.
About 0.92 g of carbon black (more specifically, the carbon black sold under designation No. M1400 by CABOT Company) and about 5.52 g of DMAC are mixed and agitated for 60 minutes. The weight ratio of the carbon black to DMAC is about 1:6. The mixture then can be processed through a grinder to obtain a carbon black slurry.

Step (2): Preparation of the Black Polyimide Film.
About 6.44 g of the carbon black slurry, and about 50 g of a PAA solution containing about 15 wt % of solid content copolymerized by 4,4'-ODA and PMDA are mixed and agitated to obtain a black PAA solution. The black PAA solution can be coated on a glass plate support and heated in an oven. The heating condition is set at a temperature of about 80° C. for 30 minutes to remove the solvent, and then between 170° C. and 370° C. for 4 hours to form a black polyimide film. The film peeled from the glass plate support contains 12 wt % of carbon black.

Comparative Example 2

A film is prepared like in Comparative Example 1 except that the carbon black slurry contains 0.355 g of carbon black and about 2.13 g of DMAC, and the obtained black polyimide film contains about 5 wt % of carbon black.

Comparative Example 3

A film is prepared like in Comparative Example 1 except that the carbon black is the one sold by Orion Company under designation No. SB4A, and the obtained black polyimide film contains about 12 wt % of carbon black.

Comparative Example 4

Step (1): Preparation of the Polyimide Matting Powder.

400 g of a PAA solution containing about 6 wt % of solid content copolymerized by 4,4'-ODA and PMDA is fed into a three-necked flask, agitated, and heated under a temperature condition increasing at a rate of 2° C./min to about 160° C., and then at 160° C. for 3 hours to form a polyimide precipitate. After cooling down to room temperature, the precipitate can be rinsed by DMAC and ethanol, undergo vacuum filtration, and then heated at about 160° C. in an oven for 1 hour to obtain the polyimide matting powder.

Step (2): Preparation of the Polyimide Film.

Under room temperature, about 0.034 g of the polyimide matting powder and about 0.204 g of DMAC are mixed and agitated for 60 minutes. The weight ratio of the PI polyimide matting powder to DMAC is about 1:6. The mixture then is processed through a grinder to obtain the polyimide powder slurry. About 0.238 g of the polyimide powder slurry and about 50 g of a PAA solution containing about 15 wt % of solid content copolymerized by 4,4'-ODA and PMDA are mixed and agitated. The mixture is then coated on a glass plate support and heated in an oven. The heating condition is set at a temperature of 80° C. for 30 minutes to remove the solvent, and then between 170° C. and 370° C. for 4 hours to form a polyimide film. The film peeled from the glass plate support contains 0.5 wt % of the polyimide matting powder and has a thickness equal to about 13 μm.

Comparative Example 5

A film is prepared like in Comparative Example 4 except that in step (2), the polyimide powder slurry contains 0.068 g of the polyimide matting powder and about 0.408 g of DMAC, and the obtained polyimide film contains about 1.0 wt % of the polyimide matting powder.

Comparative Example 6

A film is prepared like in Comparative Example 4 except that in step (2), the polyimide powder slurry contains 0.355 g of the polyimide matting powder and about 2.13 g of DMAC, and the obtained polyimide film contains about 5.0 wt % of the polyimide matting powder.

Comparative Example 7

A film is prepared like in Comparative Example 4 except that in step (2), the polyimide powder slurry contains 0.668 g of the polyimide matting powder and about 4.01 g of DMAC, and the obtained polyimide film contains about 9.0 wt % of the polyimide matting powder.

Comparative Example 8

A film is prepared like in Comparative Example 4 except that in step (2), the polyimide powder slurry contains 0.92 g of the polyimide matting powder and about 5.52 g of DMAC, and the obtained polyimide film contains about 12 wt % of the polyimide matting powder.

Comparative Example 9

A film is prepared like in Comparative Example 4 except that in step (2), the polyimide powder slurry contains 1.69 g of the polyimide matting powder and about 10.14 g of DMAC, and the obtained polyimide film contains about 20 wt % of the polyimide matting powder.

Comparative Example 10

A film is prepared like in Comparative Example 2 except that the carbon black is replaced with a conventional matting agent $SiO_2$ powder (e.g., the $SiO_2$ powder sold by GRACE Company under designation No. P405), and the obtained polyimide film contains about 5 wt % of $SiO_2$.

Comparative Example 11

A film is prepared like in Comparative Example 4 except that in step (2), the matting agent slurry contains 0.575 g of the polyimide matting powder, about 0.345 g of carbon black (more specifically, the carbon black sold under designation No. M1400 by CABOT Company), and about 5.52 g of DMAC. The obtained polyimide film contains 7.5 wt % of the polyimide matting powder and 4.5 wt % of the carbon black.

Comparative Example 12

A film is prepared like in Example 1 except that in step (1), about 310.5 g of the carbon black slurry is mixed with about 400 g of the PAA solution, and the black matting powder contains about 44.4 wt % of carbon black.

Comparative Example 13

A film is prepared like in Example 1 except that in step (1), about 388.8 g of the carbon black slurry is mixed with about 400 g of the PAA solution, and the black matting powder contains about 50 wt % of carbon black.

Comparative Example 14

A film is prepared like in Example 1 except that in step (3), the slurry of the black matting powder contains about 0.034 g of the black matting powder and about 0.204 g of DMAC, and the obtained black polyimide film contains about 0.5 wt % of the black matting powder.

Comparative Example 15

A film is prepared like in Example 1 except that in step (3), the slurry of the black matting powder contains about 0.068 g of the black matting powder and about 0.408 g of DMAC, and the obtained black polyimide film contains about 1.0 wt % of the black matting powder.

Comparative Example 16

A film is prepared like in Example 1 except that in step (3), the slurry of the black matting powder contains about 0.209 g of the black matting powder and about 1.254 g of DMAC, and the obtained black polyimide film contains about 3.0 wt % of the black matting powder.

Properties of the matting agents and the polyimide films prepared according to the aforementioned examples and comparative examples can be tested as described hereinafter.

The particle diameter of the matting powder agent can be detected by a scanning electronic microscope. The matting agent can be dispersed in a DMAC solvent, and the obtained solution can be dripped on a carbon tap and dried in an oven to prepare a sample. The dried sample is then observed under SEM with amplification 5000× and photographed. In the photo, the particle diameter of 100 randomly selected particles is measured, and the average diameter and the diameter distribution then can be derived.

The gloss meter sold under designation Micro Tri Gloss— BYK Gardner can be used to measure the 60° gloss value.

The haze meter sold under designation Nippon Denshoku NDH 2000 Haze Meter can be used to measure the total transparency (%). The film thickness (μm) is also measured, and the extinction coefficient α is derived from the following equation:

$$\alpha = -\ln T/t \quad (I)$$

wherein, "T" is the total transparency, and "t" is the film thickness. It may be possible that an increase in the film thickness cause a decrease in the total transparency. However, this effect of the film thickness may be omitted in equation (I). The extinction coefficient indicates the light transparency (%) per thickness unit of the polyimide film.

Volume resistivity of the obtained polyimide film is detected by the resistance meter Agilent 4339B with 16008B Resistivity cell.

Figure 2:
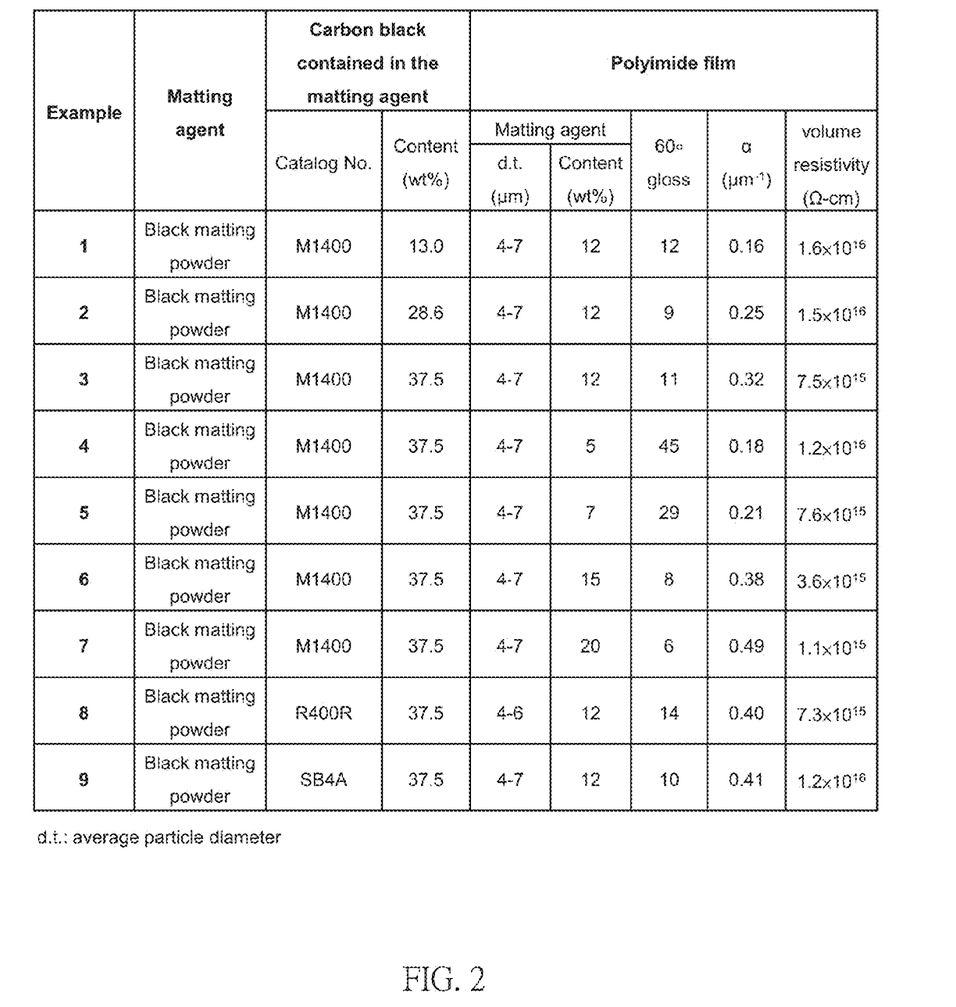
FIGS. 2 through 4 are diagrams showing test results obtained for colored matting powders and polyimide films.
Figure 3:
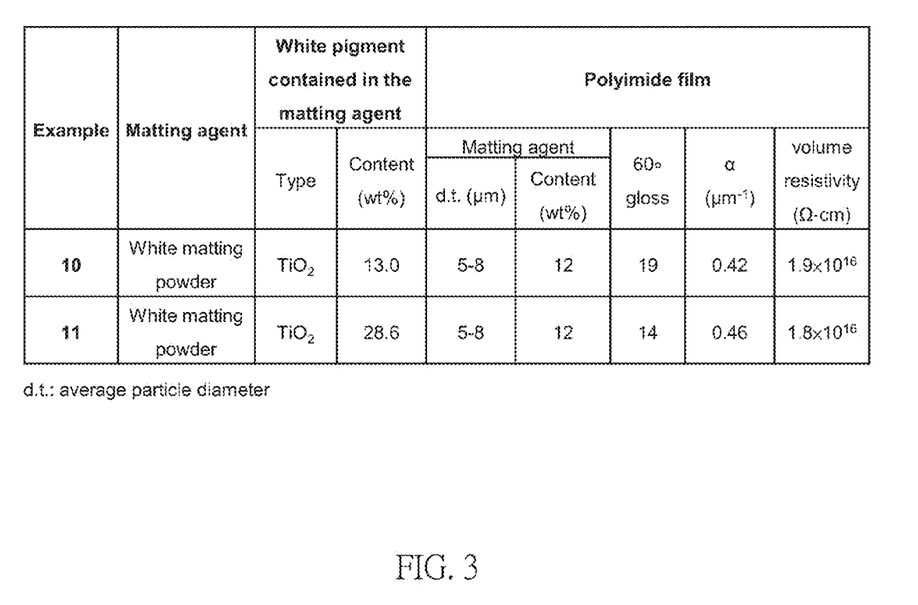
Figure 4:
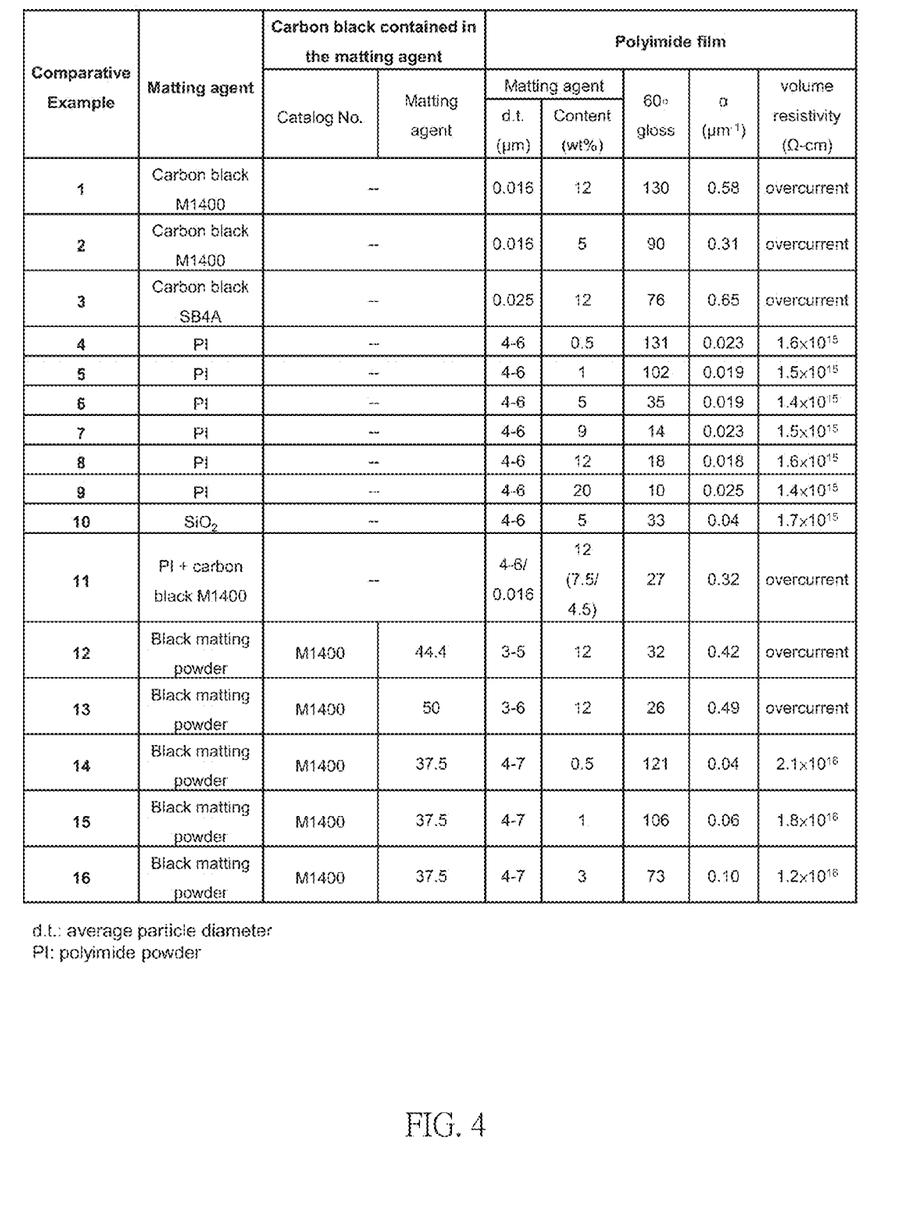

Test results are shown in FIGS. 2-4, FIG. 2 showing the test results of Examples 1-9, FIG. 3 showing the test results of Examples 10-11, and FIG. 4 showing the test results of Comparative Examples 1-16.

Comparative Examples 1-11 typically form polyimide films incorporating conventional matting agents, the test results of which are shown in FIG. 4. In Comparative Examples 1-3, carbon black is incorporated into the polyimide film as a matting agent. The test results show that the resulting films exhibit black color but have poor insulation (i.e., the film is electrically conductive). Moreover, the polyimide films of Comparative Examples 1-3 exhibit extremely high gloss.

In Comparative Examples 4-10, polyimide powder or $SiO_2$ is used as a matting agent. The test results of Comparative Example 10 reveal that using $SiO_2$ as matting agent cannot reduce transparency, i.e., it fails to enhance the extinction coefficient. Moreover, the test results obtained for Comparative Examples 4-9 show that the addition of polyimide powder without carbon black may result in low gloss and good insulation property, but is unable to reduce transparency, i.e., the extinction coefficients of Comparative Examples 4-9 remain lower than 0.05, which provides insufficient shielding.

In Comparative Example 11, the black film is fabricated through a process in which the carbon black (4.5 wt %) and a polyimide matting agent (7.5 wt %) are added separately in the polyimide film. The resulting film may have low gloss and low transparency, but has poor insulation, i.e., the film is electrically conductive.

In contrast to the comparative examples, the polyimide films incorporating the black or white matting powder can provide low gloss, low transparency (i.e., high extinction coefficient), and excellent insulation (i.e., high volume resistivity). The combination of these advantageous characteristics is unmet by the conventional polyimide films.

Figure 5:
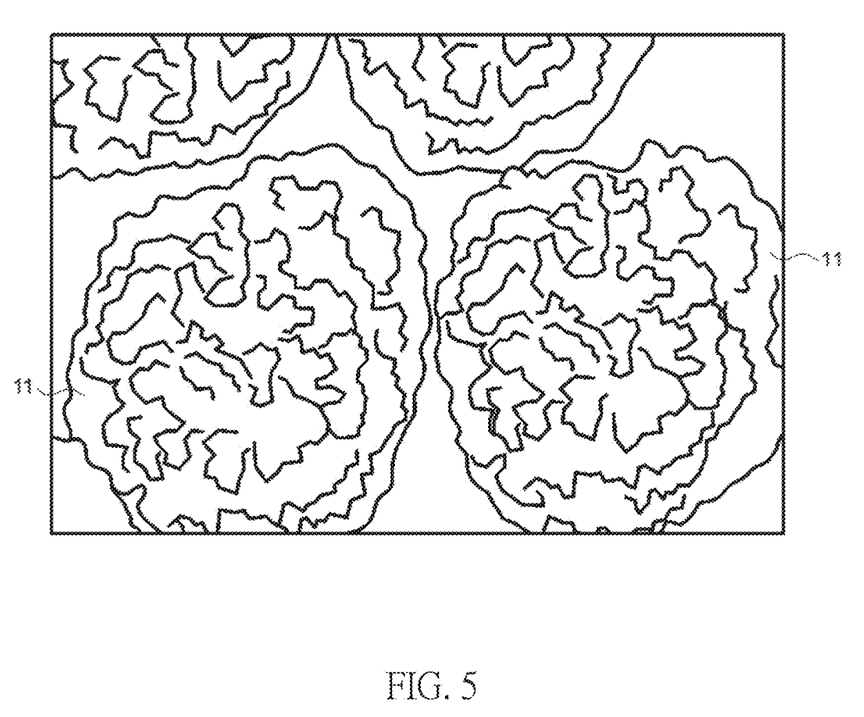
FIG. 5 is a schematic view illustrating particles of a colored matting powder.

The particles of the black or white matting powder are comprised of polyimide and black or white pigment. As shown in FIG. 5, particles 11 of the matting powder can have generally spherical shapes, and have a rough outer surface that can disperse and absorb light. The observation of these particles under SEM shows that a substantial portion of the pigment (i.e., the carbon black or white pigment) that is incorporated with the polyimide is present at the outer surface of the particles 11 and exposed outward. In other words, the pigment can act to form the rough surface of the polyimide particles 11.

In Examples 1-9, the black matting powder includes particles containing a polyimide and a carbon black, the weight ratio of the carbon black being between about 10 and about 40 wt %. The black polyimide film incorporating between about 5 and about 20 wt % of the black matting agent can have a 60° gloss value equal to or less than 40, an extinction coefficient equal to or higher than 0.15 $\mu m^{-1}$, and a volume resistivity equal to or higher than $1 \times 10^{15}$ Ω-cm.

In Examples 10 and 11, the white matting powder includes particles containing a polyimide and a white pigment, such as $TiO_2$, the weight ratio of the white pigment being between about 13 and about 29 wt %. The white polyimide film incorporating about 12 wt % of the white matting powder has a 60° gloss value equal to or less than 20, an extinction coefficient equal to or higher than 0.40 $\mu m^{-1}$, a volume resistivity equal to or higher than $1.8 \times 10^{16}$ Ω-cm, and a slurry viscosity equal to or less than about 500.

As shown in FIG. 4, when the black matting powder contains more than 40 wt % of carbon black, such as Comparative Examples 12 and 13, the resulting polyimide film has no insulation, i.e., leading to overcurrent. When the black matting powder contains less than 10 wt % of carbon black, a larger amount of the black matting powder is needed to prepare a polyimide film with a desired transparency (i.e., with a high extinction coefficient). However, the addition of a greater amount of the black matting powder increases the manufacturing cost, and poor particle dispersion may occur.

Figure 7:
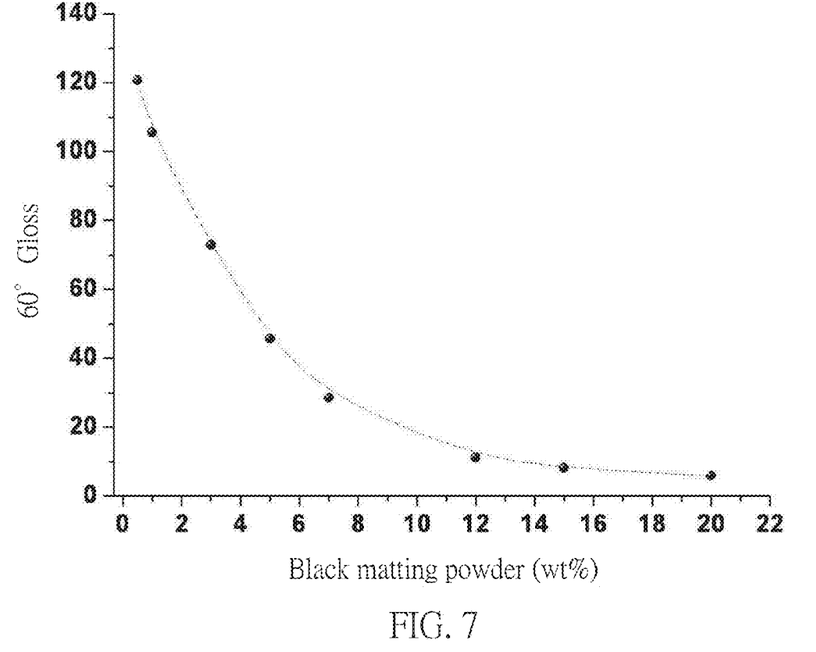
FIG. 7 plots a graph describing a relationship between the content of the matting agent and the gloss of the polyimide film.

In Comparative Examples 14-16 where the formed polyimide films respectively contain less than 5 wt % of the black matting powder, the gloss is increased to more than 70, but the shielding capability is significantly reduced and the extinction coefficient is less than about 0.15. FIG. 7 shows that the gloss of the polyimide film is not significantly affected when the weight ratio of the black matting powder is higher than 20 wt %, but a greater amount of the black matting powder increases the manufacturing cost and poor particle dispersion may occur. In other words, the obtained polyimide films obtained by Comparative Examples 12-16 are unsuitable for industrial applications.

Referring again to FIG. 4, the illustrated graph plots the relationship between the content of the matting agent and the extinction coefficient of the polyimide film based on the test results obtained for Comparative Examples 4-9, Comparative Examples 14-16 and Examples 3-9. As shown in the graph of FIG. 4, the extinction coefficient may vary according to the content of the black matting agent, i.e., the higher amount of the black matting powder, the lower transparency of the polyimide film. In contrast, the content of a conventional polyimide matting powder does not affect the extinction coefficient, e.g., the extinction coefficient of the obtained films remain less than 0.05 $\mu m^{-1}$. The films incorporating as high as 20 wt % of a conventional polyimide matting powder still exhibit extremely high transparency.

Figure 6:
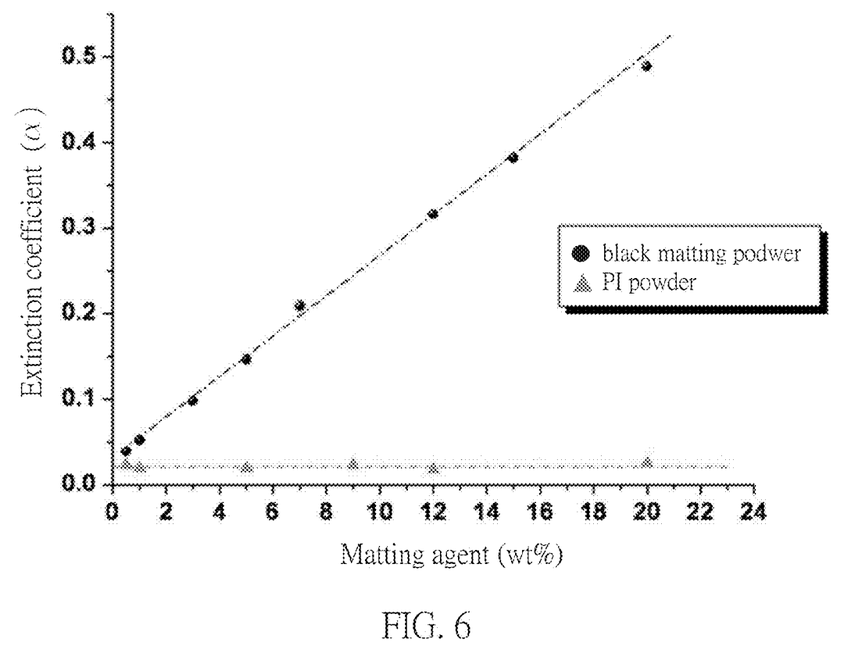
FIG. 6 plots a graph describing a relationship between the content of the matting agent and the extinction coefficient of the polyimide film.

FIG. 6 plots a relationship graph between the content of the matting agent and the extinction coefficient of the polyimide film, and FIG. 7 plots a relationship graph between the content of the black matting powder and the gloss of the polyimide film. In the graph of FIG. 6, "PI powder" refers to the polyimide matting powder containing no pigment, and "black matting powder" refers to the polyimide matting powder containing a black pigment. As shown in the graph of FIG. 6, increasing in the polyimide film the amount of the polyimide matting powder containing no pigment does not significantly affect the extinction coefficient of the polyimide film, and the values of the extinction coefficient remain approximately similar. In contrast, increasing the amount of the black matting powder can significantly raise the extinction coefficient of the polyimide film, which can become higher than the extinction coefficient value of the polyimide film in which is added a polyimide matting powder containing no pigment.

Moreover, referring to the graph of FIG. 7, increasing the amount of the black matting powder can lower the 60° gloss value of the film. When the amount of the black matting powder is higher than 10 wt %, the 60° gloss value can be as low as 20, or even lower. The graphs of FIGS. 6 and 7 thus show that adding the black matting powder can result in improved extinction.

The matting powders described herein containing a polyimide and a black or white pigment can be used to prepare a polyimide film exhibiting a desirable color, reduced gloss, enhanced shielding capability and enhanced insulation.

In conventional manufacturing processes, a colored polyimide film is usually fabricated by separately adding a matting agent and a pigment, i.e., two distinct types of powders. Compared to the conventional manufacturing processes, the matting powders described herein can impart coloration and extinction characteristics, such that one single matting powder can used in the fabrication of the polyimide film to impart the desired color and extinction property. Accordingly, the fabrication process can be simplified, the amount of additives can be reduced, and the powder dispersion can be enhanced. Moreover, interference between various additives can be prevented.

Advantages of the colored matting powders described herein include the ability to solve the problems of the conventional technique and impart high extinction, low transparency and good insulation characteristics to the formed polyimide film. These advantageous characteristics can be obtained by adding a small amount of the colored matting powder in the polyimide film. Accordingly, the fabrication process can be more cost-effective to implement, and dispersion of additives can be efficiently improved.

Realizations of the colored matting powders and polyimide films have been described in the context of particular embodiments. These embodiments are meant to be illustrative and not limiting. Many variations, modifications, additions, and improvements are possible. These and other variations, modifications, additions, and improvements may fall within the scope of the inventions as defined in the claims that follow.

What is claimed is:

1. A colored matting powder comprising:
    polyimide particles, wherein the polyimide particles comprise polyimide obtained by reacting diamine monomers with dianhydride monomers at a substantially equal molar ratio;
    a first pigment portion incorporated into the polyimide particles; and
    a second pigment portion forming an outer surface of the polyimide particles, wherein the first pigment portion and the second pigment portion are bonded to the polyimide particles.

2. The colored matting powder according to claim 1, wherein a pigment quantity comprised of the first pigment portion and the second pigment portion is present in the polyimide particles from about 10 wt % to about 40 wt % based on the total weight of the colored matting powder.

3. The colored matting powder according to claim 1, wherein the first pigment portion and the second pigment portion are each selected from the group consisting of a black pigment, a white pigment, a red pigment, an orange pigment, a yellow pigment, green pigment, a blue pigment, and a purple pigment.

4. The colored matting powder according to claim 1, wherein the first pigment portion and the second pigment portion are each a black pigment selected from a group consisting of carbon black, cobalt oxide, Fe—Mn—Bi black, Fe—Mn oxide spinel black, $(Fe,Mn)_2O_3$ black, copper chromite black spinel, lampblack, bone black, bone ash, bone char, hematite, iron oxide black, micaceous iron oxide, black complex inorganic color pigment (CICP), $CuCr_2O_4$ black, $(Ni,Mn,Co)(Cr,Fe)_2O_4$ black, aniline black, perylene black, anthraquinone black, chrome green black hematite, and iron-chromium mixed oxides.

5. The colored matting powder according to claim 1, wherein the first pigment portion and the second pigment portion are each a white pigment selected from a group consisting of titanium dioxide ($TiO_2$), aluminum oxide ($Al_2O_3$), calcium carbonate ($CaCO_3$), calcium sulfate ($CaSO_4$), silicon dioxide ($SiO_2$), boron nitride (BN), aluminum nitride (AlN), clay, zirconium oxide ($ZrO_2$), zinc oxide ($ZnO_2$), zinc sulfide ($ZnS_2$), barium sulfate ($BaSO_4$) and clay.

6. The colored matting powder according to claim 1, wherein the diamine monomers are selected from a group consisting of oxydianiline (ODA), phenylene diamine (PDA), and 2,2'-bis(trifluoromethyl) benzidine (TFMB), and the dianhydride monomers are selected from a group consisting of pyromellitic dianhydride (PMDA), 3,3',4,4'-biphenyltetracarboxylic dianhydride (BPDA) and 2,2-bis[4-(3,4-dicarboxyphenoxy) phenyl]propane dianhydride (BPADA).

7. The colored matting powder of claim 1, wherein the colored matting powder has an average particle diameter between about 3 micrometers and about 8 micrometers.

8. A colored polyimide film comprising:
    a polyimide-based polymer obtained by reacting diamine and dianhydride monomers at a substantially equal molar ratio; and
    a colored matting powder according to claim 1 distributed in the polyimide film.

9. The colored polyimide film according to claim 8, wherein the weight of the colored matting powder is between about 5 wt % and about 20 wt % based on the total weight of the colored polyimide film.

10. The colored polyimide film according to claim 8, having a 60° gloss value equal to or less than about 40.

11. The colored polyimide film according to claim 8, having has an extinction coefficient equal to or higher than about 0.15 $\mu m^{-1}$.

12. The colored polyimide film according to claim 8, having a volume resistivity equal to or higher than about $1 \times 10^{15}$ Ω-cm.

13. The colored polyimide film according to claim 8, having a 60° gloss value equal to or less than about 40, an extinction coefficient equal to or higher than about 0.15 $\mu m^{-1}$, and a volume resistivity equal to or higher than about $1 \times 10^{15}$ Ω-cm.

14. An electromagnetic interference shielding structure comprising:
    a colored polyimide film according to claim 8; and
    a metal layer disposed on at least one outer surface of the colored polyimide film.

15. The electromagnetic interference shielding structure according to claim 14, wherein the metal layer is made of aluminum (Al), copper (Cu), nickel (Ni), iron (Fe), silver (Ag), chromium (Cr), palladium (Pd), molybdenum (Mo), or an alloy thereof.

16. A method of preparing a colored polyimide film, comprising:
- obtaining a polyamic acid solution by reacting diamine and dianhydride monomers;
- adding the colored matting powder according to claim 1 into the polyamic acid solution to obtain a colored mixture solution;
- coating a layer of the colored mixture solution on a support; and
- heating the layer to form a colored polyimide film.

17. The method according to claim 16, wherein the colored matting powder has a weight between about 5 wt % and about 20 wt % based on the total weight of the colored polyimide film.

18. The method according to claim 16, wherein the colored matting powder contains a pigment selected from the group consisting of a black pigment, a white pigment, a red pigment, and a blue pigment.

19. The colored matting powder according to claim 1, wherein the second pigment portion provides for a rough outer surface of the polyimide particles.

20. The colored matting powder according to claim 1, wherein the second pigment portion provides for electrical resistance.

* * * * *